United States Patent [19]
Izumi

[11] Patent Number: 6,019,836
[45] Date of Patent: Feb. 1, 2000

[54] METHOD FOR PULLING A SINGLE CRYSTAL

[75] Inventor: Teruo Izumi, Amagasaki, Japan

[73] Assignee: Sumitomo Metal Industries, Ltd., Osaka, Japan

[21] Appl. No.: 09/019,981

[22] Filed: Feb. 6, 1998

[51] Int. Cl.[7] .................................................. C30B 15/20
[52] U.S. Cl. ................................ 117/13; 117/14; 117/15
[58] Field of Search .................................. 117/13, 14, 15

[56] References Cited

U.S. PATENT DOCUMENTS

| | | | |
|---|---|---|---|
| 5,126,113 | 6/1992 | Yamagishi et al. | 422/249 |
| 5,578,284 | 11/1996 | Chandrasekhar et al. | 423/348 |
| 5,628,823 | 5/1997 | Chandrasekhar et al. | 117/15 |
| 5,779,790 | 7/1998 | Marai et al. | 117/13 |
| 5,800,612 | 9/1998 | Shimomura et al. | 117/201 |

FOREIGN PATENT DOCUMENTS 5-43379  2/1993  Japan .
8-319192 12/1996 Japan .

Primary Examiner—Felisa Hiteshew
Attorney, Agent, or Firm—Weneroth, Lind & Ponack, L.L.P.

[57] ABSTRACT

In a conventional method for pulling a single crystal, a neck having a smaller diameter has been formed in order to exclude dislocation induced in dipping a seed crystal into a melt. However, in pulling a heavy single crystal having a large diameter of 12 inches or more, the single crystal cannot be supported and falls. When the diameter of the neck is large enough to prevent the fall, the dislocation cannot be excluded and propagates to the single crystal. According to the present invention, in a method for pulling a single crystal wherein a seed crystal is brought into contact with a melt within a crucible and then, a neck and a main body are formed, by setting the rotational speed of the seed crystal in the neck formation lower than the rotational speed thereof in the main body formation, dislocation can be efficiently excluded outward even if the neck is not too much narrowed down.

6 Claims, 4 Drawing Sheets

(a)

(b)

(c)

(d)

METHOD FOR PULLING A SINGLE CRYSTAL

BACKGROUND OF THE INVENTION

1. Field of the Invention

The present invention relates to a method for pulling a single crystal and, more particularly, to a method for pulling a single crystal wherein a single crystal of silicon, or the like, is pulled from a melt of a material for forming a single crystal by a pulling method such as the Czochralski method (hereinafter, referred to as the CZ method).

2. Description of the Related Art

At present, the majority of silicon single crystals used for manufacturing a substrate for forming a circuit component of a LSI (large scale integrated circuit) and the like have been pulled by the CZ method. FIG. 1 is a diagrammatic sectional view of an apparatus for pulling a single crystal used for the CZ method, and in the figure, reference numeral 21 represents a crucible.

The crucible 21 comprises a bottomed cylindrical quartz crucible 21a and a bottomed cylindrical graphite crucible 21b fitted on the outer side of the quartz crucible 21a. The crucible 21 is supported with a support shaft 28 which rotates in the direction shown by the arrow A in the figure at a prescribed speed. A heater 22 of a resistance heating type and a heat insulating material 27 arranged around the heater 22 are concentrically arranged around the crucible 21. The crucible 21 is charged with a melt 23 of a material for forming a crystal which is melted by the heater 22. On the central axis of the crucible 21, a pulling axis 24 made of a pulling rod or wire is suspended, and at the front thereof, a seed crystal 25 is held by a holder 24a. These parts are arranged within a water cooled type chamber 29 wherein pressure can be controlled.

A method for pulling a single crystal 26 using the above-mentioned apparatus for pulling a single crystal is described below by reference to FIGS. 1 and 2. FIGS. 2(a)–(d) are partial magnified front views diagrammatically showing the seed crystal and the vicinity thereof in each step in pulling a single crystal.

Although it is not shown in FIG. 2, an inert gas is induced into the chamber 29 so as to make an inert gas atmosphere under reduced pressure, and then, the material for forming a crystal is melted by the heater 22. The situation is maintained for a period of time so as to sufficiently release gas contained in the melt 23.

While the pulling axis 24 is rotated on the same axis in the reverse direction of the support shaft 28 at a prescribed speed, the seed crystal 25 held by the holder 24a is caused to descend and is brought into contact with the melt 23 so as to make the seed crystal 25 partially melt into the melt 23. Then, the pulling of the single crystal 26 is started (hereinafter, referred to as the seeding step) (FIG. 2(a)).

In making a single crystal grow at the front of the seed crystal 25, the pulling axis 24 is pulled away from the melt 23 at a higher speed than the below-described pulling speed in forming a main body 26c. The crystal is narrowed down to have a prescribed diameter, leading to the formation of a neck 26a (hereinafter, referred to as the necking step) (FIG. 2(b)).

By slowing down the pulling speed of the pulling axis 24 (hereinafter, simply referred to as the pulling speed), the neck 26a is made to grow to have a prescribed diameter, leading to the formation of a shoulder 26b (FIG. 2(c)).

By pulling the pulling axis 24 at a fixed rate, the main body 26c having a uniform diameter and a prescribed length is formed (FIG. 2(d)).

Although it is not shown in FIG. 2, in order to prevent induction of high density dislocation to the single crystal 26 by a steep temperature gradient in the last stage, the diameter thereof is gradually decreased, leading to the formation of an end-cone. Then, the single crystal 26 is separated from the melt 23 and is cooled, which is at the end of the pulling of the single crystal 26.

One of the most important steps in the pulling of the single crystal 26 is the above-mentioned necking step (FIG. 2(b)). The object of the necking step is described below. Before the seeding step (FIG. 2(a)), the seed crystal 25 is caused to once stop immediately above the surface of the melt 23, is preheated by the melt 23, and is then brought into contact with the melt 23. There is usually a difference of 100° C. or more between the temperature of the lower portion 25a of the seed crystal 25 after preheating (about 1300° C. and less) and the melting point of the seed crystal 25 (about 1410° C.). Therefore, when the seed crystal 25 is brought into contact with the melt 23, the lower portion 25a of the seed crystal 25 has a steep temperature gradient, leading to the induction of the dislocation caused by a thermal stress into the lower portion 25a of the seed crystal 25. It is necessary to make the single crystal 26 grow after excluding the dislocation which inhibits single crystal growth. Since the dislocation generally grows in the vertical direction to the growth interface of the single crystal 26, the shape of the growth interface (the front plane of the neck 26a) is made to be downward convex in the necking step, so as to exclude the dislocation outward.

In the necking step, the faster the pulling speed is made, the smaller the diameter of the neck 26a becomes and the more downward convex the shape of the growth interface becomes. As a result, the dislocation can be inhibited from propagating and can be efficiently excluded.

In the above method for pulling a single crystal, the seed crystal 25 having a diameter of about 12 mm has been generally used in order to pull the single crystal 26 having a diameter of about 6 inches and a weight of 80 kg or so. The larger the diameter of the neck 26a is, the more safely the single crystal 26 is held, while the smaller the diameter of the neck 26a is, the more efficiently the dislocation is excluded. In order to meet both of the requirements, the neck 26a having a diameter of about 3 mm has been selected. Recently, however, in order to manufacture a more highly integrated semiconductor device at a lower cost and more efficiently, the wafer has been required to have a larger diameter. Now, for example, the production of the single crystal 26 having a diameter of about 12 inches (300 mm) and a weight of 300 kg or so is desired. In this case, the neck 26a having a conventional diameter (usually 3 mm or so) cannot withstand the weight of the pulled single crystal 26 and breaks, resulting in the falling of the single crystal 26.

In growing the heavy single crystal 26, the diameter of the neck 26a needs to be about 6 mm or more, in order to prevent the occurrence of troubles such as a fall of the single crystal 26 and to pull the single crystal 26 safely, which diameter is calculated from the silicon strength (about 16 kgf/mm$^2$). However, when the diameter of the neck 26a is 6 mm or more, the dislocation induced to the seed crystal 25 in dipping the seed crystal 25 into the melt 23 cannot be sufficiently excluded using known methods.

SUMMARY OF THE INVENTION

In order to solve the above problems, a method was examined by the inventor wherein the diameter of a neck is not too narrow down in the necking step and dislocation induced to a seed crystal is efficiently excluded in the neck.

When the rotational speed of the seed crystal was decreased, the forced convection accompanying the revolution of the seed crystal within a melt was inhibited so that the natural convection accompanying the heating by heater became comparatively strong. As a result, it was found that the shape of the growth interface of a single crystal can be made more downwardly convex so that the dislocation can be excluded without reducing the diameter of the neck too much. The present invention was thus completed.

A method for pulling a single crystal (1) according to the present invention is provided wherein a seed crystal is brought into contact with a melt within a crucible and then, a neck and a main body are formed, is characterized by setting the rotational speed of the seed crystal in the neck formation lower than the rotational speed thereof in the main body formation.

A method for pulling a single crystal (2) according to the present invention is also provided wherein a seed crystal is brought into contact with a melt within a crucible and then, a neck and a main body are formed, is characterized by setting the rotational speed of the seed crystal in the neck formation within the range of 1–12 rpm.

In the method for pulling a single crystal (1) or (2), by setting the rotational speed of the seed crystal at a low speed, the forced convection accompanying the revolution of the seed crystal within the melt is inhibited so that the natural convection accompanying the heating by the heater is made comparatively strong. As a result, the shape of the growth interface of the single crystal can be made more downwardly convex so that the dislocation can be efficiently excluded outward without reducing the diameter of the neck too much. Accordingly, even when a heavier single crystal is pulled, the single crystal can be supported sufficiently by the neck having a large diameter.

DETAILED DESCRIPTION OF THE PREFERRED EMBODIMENTS

The method for pulling a single crystal according to the present invention is described below. The method for pulling a single crystal according to the invention is described based on the assumption that a heavy single crystal having a large diameter of 12 inches or more is pulled.

Figure 1:
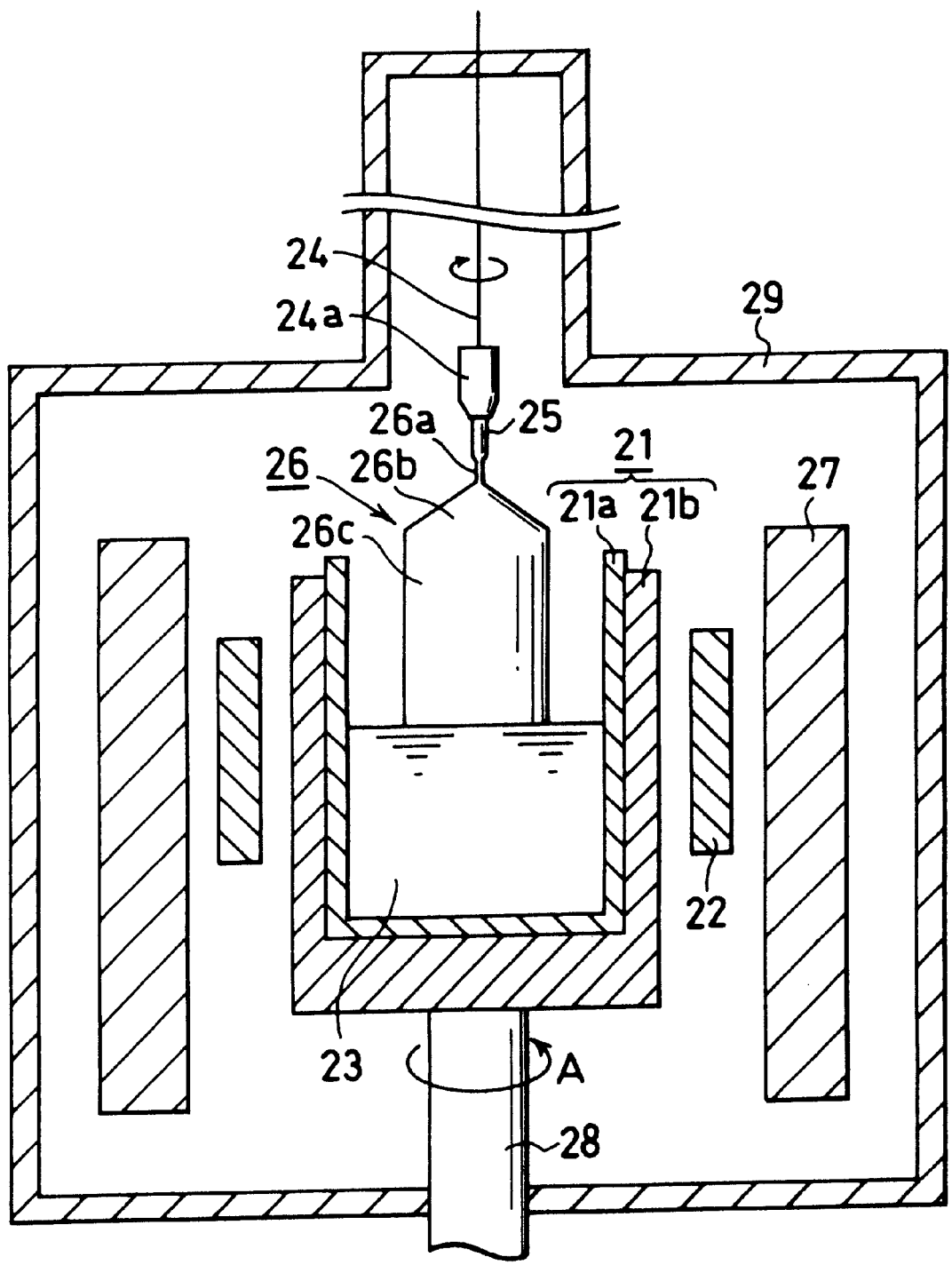
FIG. 1 is a diagrammatic sectional view showing an apparatus for pulling a single crystal used for the CZ method.

Since in the method for pulling a single crystal according to the invention, the same apparatus for pulling a single crystal as that shown in FIG. 1 is used, the description of the apparatus is herein before and only the method for pulling a single crystal is further described.

FIGS. 3(a)–(d) are partial magnified front views diagrammatically showing a seed crystal and the vicinity thereof in each step in the method for pulling a single crystal according to the invention.

Figure 3:
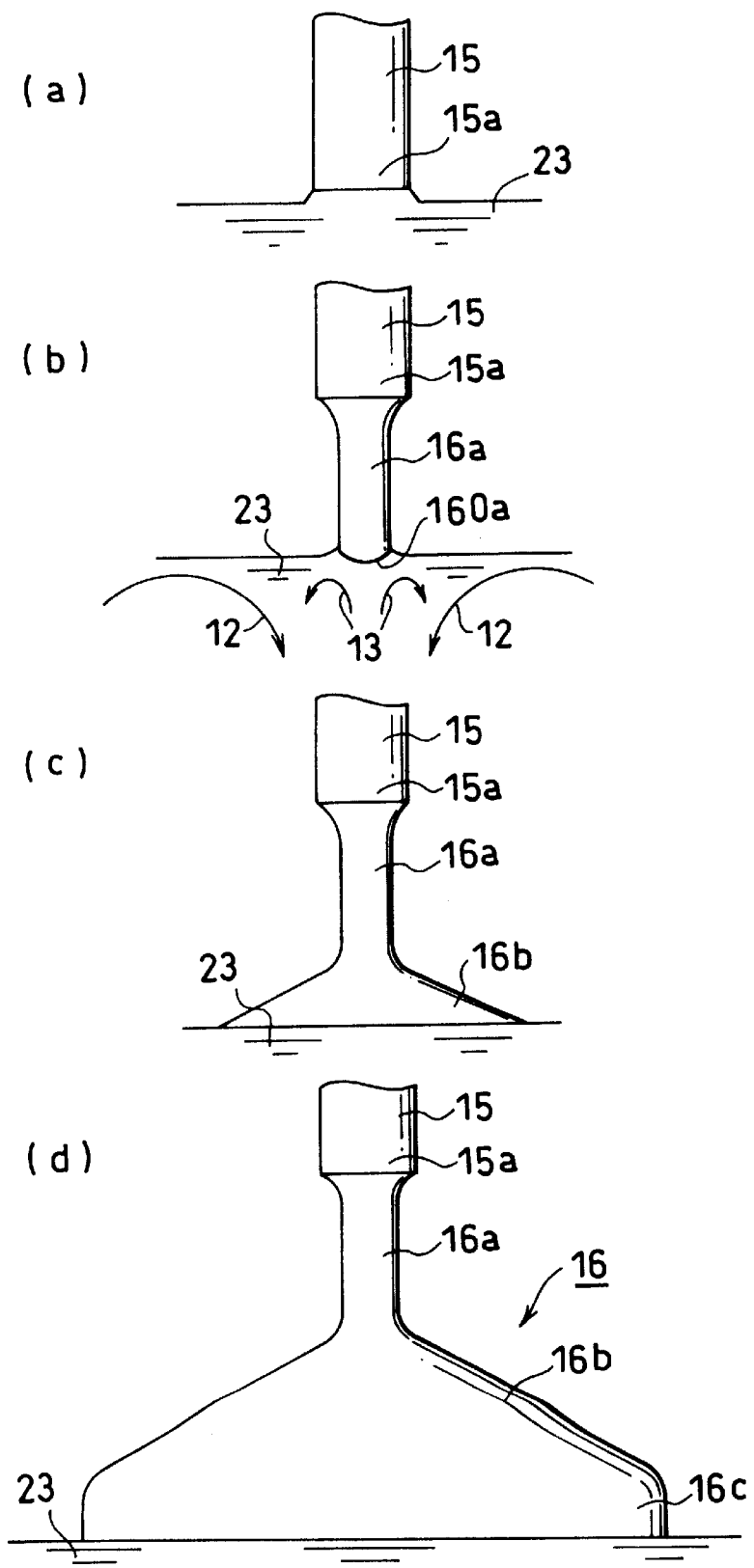
FIGS. 3(a)–(d) are partial magnified front views diagrammatically showing a seed crystal and the vicinity thereof in the method for pulling a single crystal according to the present invention.

While a pulling axis 24 is rotated on the same axis in the reverse direction of a support shaft 28 at a prescribed speed, the seed crystal 15 held by a holder 24a is caused to descend to the position at a prescribed distance above the surface of the melt 23, where the seed crystal 15 is caused to once stop descending so as to be preheated, and is thereafter brought into contact with the melt 23 (FIG. 3(a)).

Since there is a difference between the temperature of the lower portion 15a of the seed crystal 15 and that of the melt 23, dislocation is induced to the lower portion 15a of the seed crystal 15 by a thermal shock in contact with the melt. In order to inhibit the dislocation from propagating, a neck 16a is formed after contact with the melt.

In the necking step, by setting the revolution speed of the seed crystal 15 low, the forced convection 13 accompanying the revolution thereof within the melt 23 is inhibited so that the natural convection 12 accompanying the heating by heater is made comparatively strong (FIG. 3(b)).

In the instant method, the shape of the growth interface 160a of the neck 16a can be more downwardly convex, so that the dislocation induced to the seed crystal 15 can be efficiently excluded even if the diameter of the neck is not reduced too much. The rotational speed of the seed crystal 15 in the formation of the neck 16a need be suitably controlled according to the size of a crucible 21, the rotational speed thereof, power of a heater 22, and the like. For example, the rotational speed of the seed crystal 15 is preferably chosen within the range of 1–12 rpm.

When the rotational speed thereof in the formation of the neck 16a is less than 1 rpm, a crystal is easily warped in growing. On the other hand, when the rotational speed thereof exceeds 12 rpm, the forced convection 13 caused by the neck 16a within the melt 23 becomes too strong compared with the natural convection 12, so that it is difficult to make the shape of the growth interface 160a mostly downwardly convex. At that time, the pulling speed of the seed crystal 15 is preferably 1.5–4.0 mm/min. In the pulling of the crystal under the above conditions, the dislocation can be efficiently excluded even when the smallest diameter portion of the neck 16a is 6–10 mm or so, which is larger than a conventional diameter of 3 mm.

By thereafter pulling the seed crystal 15 at a prescribed speed while the rotational speed thereof is increased to 15–50 rpm or so, a shoulder 16b is formed (FIG. 3(c)).

Then, by pulling the seed crystal 15 at a prescribed speed while the rotational speed thereof is set at a fixed speed within the range of 15–50 rpm, a main body 16c is formed (FIG. 3(d)).

Then, the single crystal 16 is pulled in the same manner as described in the Prior Art, is separated from the melt 23 and is cooled, which is at the end of the pulling of the single crystal 16.

EXAMPLES AND COMPARATIVE EXAMPLES

Figure 2:
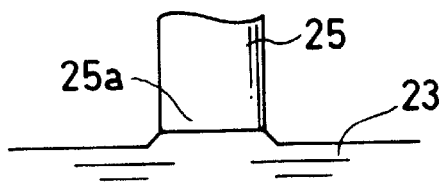
FIGS. 2(a)–(d) are partial magnified front views diagrammatically showing a seed crystal and the vicinity thereof in a conventional method for pulling a single crystal.
Figure 2:
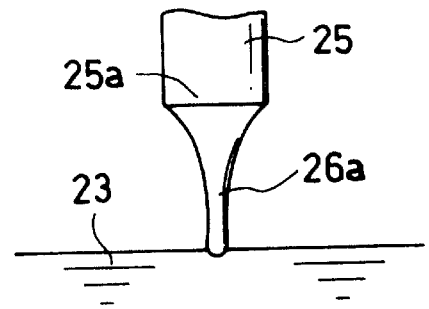
Figure 2:
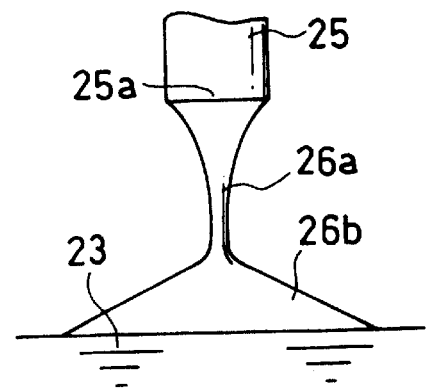
Figure 2:
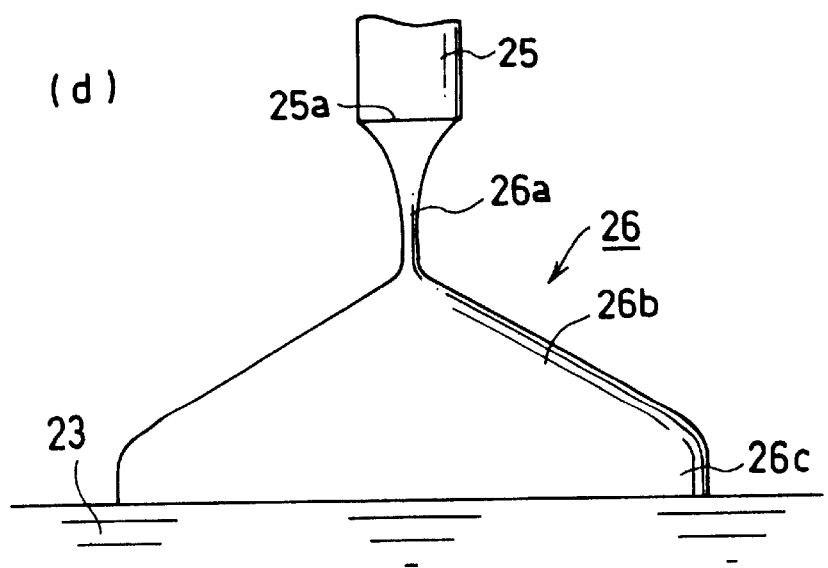

The method for pulling a single crystal according to the present invention is described below in the Examples. As a comparison, the case wherein a single crystal was pulled by a conventional method shown in FIG. 2 and the case wherein the rotational speed of a seed crystal was not decreased sufficiently are described below in the Comparative Examples. The conditions under which these tests were conducted are shown in Tables 1 and 2.

TABLE 1

(Common conditions to Examples 1 and 2, and Comparative Examples 1–3)

| | |
|---|---|
| Shape of pulled single crystal 16 or 26 | Diameter: about 300 mm (12 inches), Length: about 1000 mm, and Weight: about 270 kg |
| Prepared quantity of material for crystal | 300 kg |
| Atmosphere in chamber 29 | Ar atmosphere |
| Flow of Ar | 80 liter/min |
| Pressure | $1.33 \times 10^3$ Pa |
| Rotational speed of crucible 21 | 5 rpm |
| Diameter of seed crystal | 12 mm |
| Number of pulls | 10 times in each Example and Comparative Example |

TABLE 2

Figure 4:
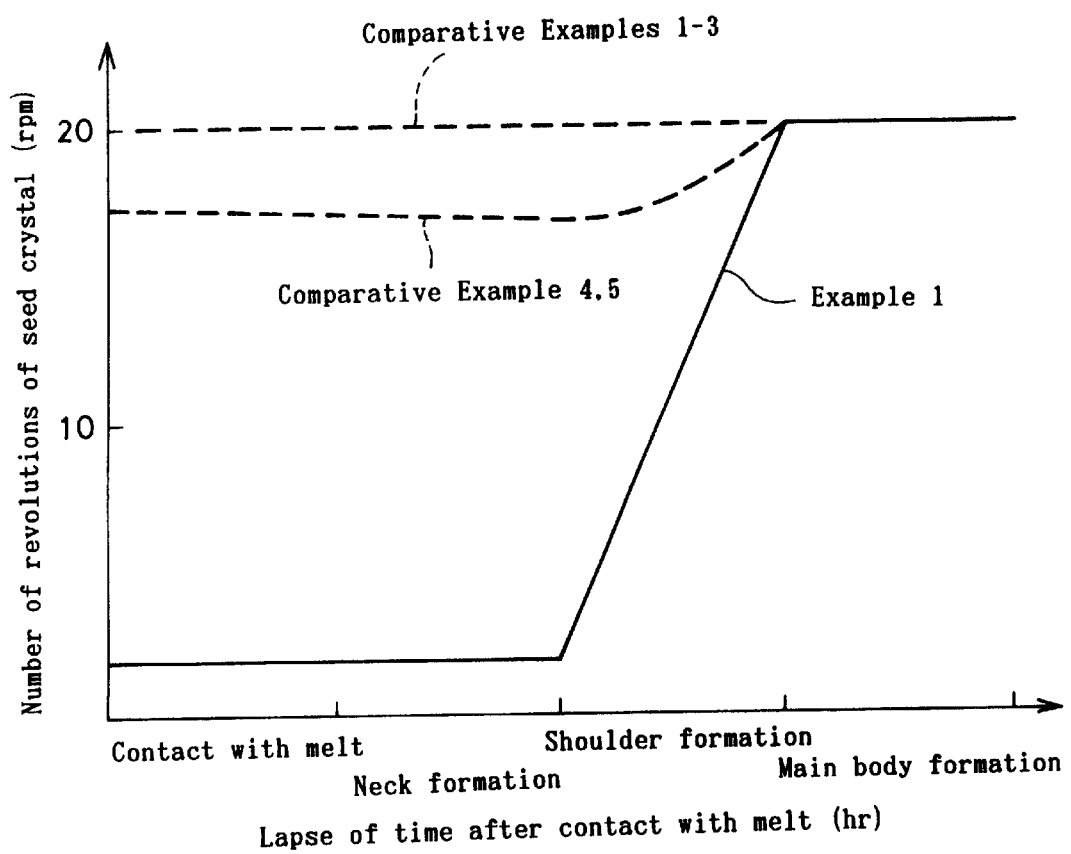
FIG. 4 is a graph indicating the relationship between the lapse of time after contact with the melt and the rotational speed of the seed crystal.

| | |
|---|---|
| Conditions in Exaples 1 and 2 | |
| Relationship between lapse of time after contact of seed crystal 15 with melt and revolution speed in each Example | shown in FIG. 4 |
| Pulling speed of single crystal 16 in neck 16a formtion | 2.5 mm/min |
| Diameter of neck 16a | Example 1: 10 mm and Example 2: 6 m |
| Pulling speed of single 16 in shoulder 16b formation | 0.3 mm/min |
| Pulling speed of single 16 in main body 16c formation | 0.5 mm/min |
| Conditions in Conparative Examples 1, 2 and 3 | |
| Relationship between lapse of time after contact of seed crystal 25 with melt and revolution speed | Shown in FIG. 4 |
| Pulling speed of single crystal 26 in neck 26a formation | 2.5 mm/min |
| Diameter of neck 26a | Comparative Example 1: 4 mm, Comparative Example 2: 10 mm, and Comparative Example 3: 6 mm, |
| Pulling speed of single crystal 26 in shoulder 26b formation | 0.3 mm/min |
| Pulling speed of single crystal 26 in main body 26c formation | 0.5 mm/min |
| Conditions in Comparative Examples 4 and 5 | |
| Relationship between lapse of time after contact of seed crystal 15 with melt and revolution speed | Shown in FIG. 4 |
| Pulling speed of single crystal 26 in neck formation | 2.5 mm/min |
| Diameter of neck | Comparative Example 4: 10 mm, and Comparative Example 5: 6 mm, |
| Pulling speed of single crystal 26 in shoulder 26b formation | 0.3 mm/min |
| Pulling speed of single crystal 26 in main body 26c formation | 0.5 mm/min |

How to examine DF (Dislocation Free) rate of pulled single crystals

The pulled single crystals 16 or 26 were sliced in parallel to the growth direction (length direction), and X-ray topographies of the obtained single crystals 16 or 26 were measured, from which the DF rate was judged. That is, the single crystals 16 or 26, in which dislocation was found even slightly from the X-ray topographies, were judged as having dislocation. The rate of dislocation-free single crystals (DF) in ten pulled single crystals was examined by the above measurement.

Results of Examples 1 and 2, and Comparative Examples 1–5

The DF rates and the ratio of falls of the single crystals 16 and 26 according to Examples 1 and 2, and Comparative Examples 1–5 are shown in Table 3.

TABLE 3

| | DF rate (%) | Ratio of falls |
|---|---|---|
| Example 1 | 70% (7/10) | 0 (/10) |
| Example 2 | 90% (9/10) | 0 (/10) |
| Comparative Example 1 | 90% (9/10) | 8 (/10) |
| Comparative Example 2 | 0% (0/10) | 0 (/10) |
| Comparative Example 3 | 0% (0/10) | 0 (/10) |
| Comparative Example 4 | 0% (0/10) | 0 (/10) |
| Comparative Example 5 | 0% (0/10) | 0 (/10) |

As is obvious from the results shown in Table 3, in Examples 1 and 2, the DF rates of the pulled single crystals 16 were 70% (7/10) and 90% (9/10). respectively, which were large, even though the necks 16a were 10 mm and 6 mm, which were large, since the rotational speed of the seed crystal 15 was set small. Since the diameters of the seed crystals 15 were 6 mm or more, which were large, the ratio of falls was 0/10 in both cases.

On the other hand, in Comparative Example 1, since the diameters of the necks 26a were narrowed down to be 4 mm, the DF rate was favorably 90% (9/10). But since the single crystals 26 could not be supported sufficiently, the ratio of falls was 8/10, which was large. In Comparative Examples 2 and 3, since the rotational speed of the seed crystals 25 was kept 20 rpm, which was large, from contact with the melt to the formation of the main body 26c, the dislocation induced to the seed crystals 25 could not be excluded so that the DF rates were 0% (0/10), though the diameters of the necks 26a were the same as those in Examples 1 and 2 (10 mm or 6 mm). In Comparative Examples 4 and 5, since the rotational speed of the seed crystals was 17 rpm, which was not sufficiently small, the dislocation induced to the seed crystals 25 could not be inhibited from propagating, though the diameters of the necks 26a were 10 mm or 6 mm, and the rotational speed of the seed crystals in the neck formation was set low. As a result, the dislocation was found in all of the pulled single crystals 26.

What is claimed is:

1. A method for pulling a single crystal, comprising bringing a seed crystal into contact with a melt within a crucible, and forming a neck and a main body of the single crystal, wherein the rotational speed of the seed crystal in the neck formation is set lower than the rotational speed thereof in the main body formation.

2. The method of claim 1, wherein the diameter of the main body of the single crystal is greater than 12 inches.

3. The method of claim 1, wherein the rotational speed during the main body formation is within the range 15–50 rpm.

4. A method for pulling a single crystal, comprising bringing a seed crystal into contact with a melt within a crucible, and forming a neck and a main body of the single crystal, wherein the rotational speed of the seed crystal in the neck formation is within the range of 1–12 rpm.

5. The method of claim 4, wherein the diameter of the main body of the single crystal is greater than 12 inches.

6. The method of claim 4, wherein the rotational speed during the main body formation is within the range 15–50 rpm.

* * * * *